United States Patent
Park et al.

(10) Patent No.: US 8,300,463 B2
(45) Date of Patent: Oct. 30, 2012

(54) NONVOLATILE MEMORY DEVICE AND RELATED PROGRAMMING METHOD

(75) Inventors: Ki Tae Park, Seongnam-si (KR);
Myoung Gon Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 12/726,408

(22) Filed: Mar. 18, 2010

(65) Prior Publication Data

US 2010/0246266 A1 Sep. 30, 2010

(30) Foreign Application Priority Data

Mar. 25, 2009 (KR) ........................ 10-2009-0025330

(51) Int. Cl.
*G11C 16/04* (2006.01)
*G11C 16/06* (2006.01)
*G06F 13/00* (2006.01)

(52) U.S. Cl. ......... 365/185.09; 365/185.11; 365/185.33; 711/103; 711/E12.001; 711/E12.008

(58) Field of Classification Search .............. 365/185.09
See application file for complete search history.

(56) References Cited

U.S. PATENT DOCUMENTS

| | | | | |
|---|---|---|---|---|
| 5,956,473 A * | 9/1999 | Ma et al. | ......................... | 714/5.1 |
| 6,230,233 B1 * | 5/2001 | Lofgren et al. | ............... | 711/103 |
| 6,732,221 B2 * | 5/2004 | Ban | ............................... | 711/103 |
| 6,831,865 B2 * | 12/2004 | Chang et al. | ............. | 365/185.33 |
| 7,032,087 B1 * | 4/2006 | Chang et al. | .................. | 711/156 |
| 7,096,313 B1 * | 8/2006 | Chang et al. | .................. | 711/103 |
| 7,224,604 B2 * | 5/2007 | Lasser | ...................... | 365/185.09 |
| 7,254,668 B1 | 8/2007 | Chang et al. | | |
| 7,552,272 B2 * | 6/2009 | Gonzalez et al. | ............. | 711/103 |
| 7,764,550 B2 * | 7/2010 | Suhail et al. | ............. | 365/185.28 |
| 7,903,486 B2 * | 3/2011 | Danilak | ........................ | 365/201 |
| 7,992,061 B2 * | 8/2011 | Zeng | ............................. | 714/723 |
| 2006/0256623 A1 | 11/2006 | Roohparvar | | |
| 2007/0233931 A1 * | 10/2007 | Tanaka et al. | ..................... | 711/5 |
| 2009/0122615 A1 * | 5/2009 | Jang et al. | ................ | 365/185.18 |
| 2009/0182936 A1 * | 7/2009 | Lee | ................ | 711/103 |
| 2010/0037006 A1 * | 2/2010 | Chen et al. | .................... | 711/103 |
| 2010/0228907 A1 * | 9/2010 | Shen | ............................ | 711/103 |
| 2010/0268865 A1 * | 10/2010 | Ramiya Mothilal | .......... | 711/103 |
| 2010/0332922 A1 * | 12/2010 | Chang et al. | .................. | 714/704 |
| 2012/0017053 A1 * | 1/2012 | Yang et al. | .................... | 711/154 |

FOREIGN PATENT DOCUMENTS

KR 1020050036772 A 4/2005

\* cited by examiner

*Primary Examiner* — Son Mai (74) *Attorney, Agent, or Firm* — Volentine & Whitt, PLLC (57) ABSTRACT

A nonvolatile memory device comprises a memory cell array comprising a plurality of memory blocks each divided into a plurality of regions, and a control logic component. The control logic component selects a memory block to be programmed based on program/erase cycles of the memory blocks, and selects a program rule used to program the regions of the selected memory block.

16 Claims, 12 Drawing Sheets

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2009-0025330 filed on Mar. 25, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices and related methods of programming.

Semiconductor memory devices can be roughly categorized into volatile memory devices and nonvolatile memory devices. Volatile memory devices tend to have rapid read and write speeds, but they lose stored data when disconnected from power. By contrast, nonvolatile memory devices retain stored data even when disconnected from power. Thus, nonvolatile memory devices are commonly used to store data that must be retained even in the absence of power.

Examples of nonvolatile memory devices include, for instance, mask read-only memories (MROMs), programmable read-only memories (PROMs), erasable programmable read-only memories (EPROMs), and electrically erasable programmable read-only memories (EEPROMs).

Unfortunately, MROMs, PROMs, and EPROMs have difficulty updating data because they cannot be freely erased and/or programmed. EEPROMs, on the other hand, can be readily erased and programmed and are therefore used commonly in systems requiring frequent data updates or in auxiliary memory systems.

Flash memory is a form of EEPROM having a relatively high integration density compared with other forms of EEPROM. As a result, flash memory has become widely adopted to provide mass memory storage in auxiliary memory systems. Among the different types of flash memory, there are NAND-type flash memory and NOR-type flash memory, and among these, NAND-type flash memory tends to have the highest integration density.

In many systems, flash memory is repeatedly programmed and erased. Unfortunately, however, there are limits on the number of times that a flash memory can be programmed and/or erased before its memory cells or blocks wear out. Memory cells or blocks may wear out, for instance, through break down of an oxide layer between a control gate and a floating gate of the memory cells. Once a memory cell or blocks wears out, functional degradation and loss of data may occur in the corresponding part of the flash memory.

The lifetime of flash memory blocks is typically measured by a number of erase cycles. For instance, some memory blocks may withstand an average of 100,000 erase cycles before wearing out. Accordingly, to maximize the lifetime of a flash memory device, a conventional flash memory device may distribute erase cycles evenly between different regions of the device.

SUMMARY

Embodiments of the inventive concept relate to a nonvolatile memory device and related methods of programming in which program and erase cycles are distributed across different regions of the nonvolatile memory device.

According to one embodiment of the inventive concept, a nonvolatile memory device comprises a memory cell array and a control logic component. The memory cell array comprises a plurality of memory blocks respectively divided into a plurality of regions. The control logic component is to select one of the memory block to be programmed based on a program or erase count of each of the respective memory blocks, and is further configured to determine a program rule to be applied to the selected memory block based on program or erase counts of the respective regions of the selected memory block.

In certain embodiments, the control logic component programs the selected memory block using a first program rule if a difference between a maximum program or erase count and a minimum program or erase count of the respective regions of the selected memory block is less than a predetermined reference value, and otherwise, the control logic component programs the selected memory block using a second program rule. The first program rule requires the regions of the selected memory block to be programmed in a first direction and the second program rule requires the regions of the selected memory block to be programmed in a second direction opposite the first direction.

In certain embodiments, the first program rule causes the regions of the selected memory block to be programmed in an order beginning at a first outermost region and progressing toward a second outermost region.

In certain embodiments, the control logic component programs the selected memory block using a first program rule if the difference between a maximum program or erase count and a minimum program or erase count of the respective regions of the selected memory block is less than a predetermined reference value, and otherwise, the control logic component programs the selected memory block using a second program rule, and the first program rule requires the regions of the selected memory block to be programmed in a first direction starting with a first region and the second program rule requires the regions of the selected memory block to be programmed in the first direction starting with a second region different from the first region.

In certain embodiments, the first region is an outermost region of the memory block and the second region is a non-outermost region of the memory block.

In certain embodiments, the second region is a region that has a program or erase count close to a predetermined reference number stored in the control logic component.

In certain embodiments, the second program rule requires the control logic component to inhibit programming of regions between the first region and the second region.

In certain embodiments, the control logic component selects a memory block having a low program or erase count among the plurality of memory blocks and programs the selected memory block using a rule that requires the regions of the selected memory block to be programmed in an order beginning with a region having a lowest program or erase count.

In certain embodiments, the control logic component stores a table comprising program or erase counts for the plurality of memory blocks and program or erase counts for the respective regions of the plurality of memory blocks.

In certain embodiments, the memory cell array is a NAND flash memory cell array.

According to another embodiment of the inventive concept, a method of programming a nonvolatile memory device comprises selecting a memory block having a low program or erase count from a plurality of memory blocks, selecting a program rule to be applied to the selected memory block based on information regarding program or erase counts of respective regions within the selected memory block, and programming one of the regions of the selected memory block using the changed program rule.

In certain embodiments, selecting the program rule comprises selecting a first rule as the program rule if a difference between a maximum program or erase count and a minimum program or erase count of the respective regions of the selected memory block is less than a predetermined reference value, and otherwise, selecting a second rule as the program rule;

wherein the first rule requires the regions of the selected memory block to be programmed in a first direction and the second rule requires the regions of the selected memory block to be programmed in a second direction opposite the first direction.

In certain embodiments, selecting the program rules comprises selecting a first rule as the program rule if a difference between a maximum program or erase count and a minimum program or erase count of the respective regions of the selected memory block is less than a predetermined reference value, and otherwise, selecting a second rule as the program rule. The first rule requires the regions of the selected memory block to be programmed in a first direction starting with a first region and the second program rule requires the regions of the selected memory block to be programmed in the first direction starting with a second region different from the first region.

In certain embodiments, the first region is an outermost region of the memory block and the second region is a non-outermost region of the memory block.

In certain embodiments, the second region is a region that has a program or erase count close to a predetermined reference number stored in the control logic component.

In certain embodiments, the second rule requires the control logic component to inhibit programming of regions between the first region and the second region.

BRIEF DESCRIPTION OF THE DRAWINGS

Embodiments of the inventive concept are described below with reference to the accompanying drawings. In the drawings, like reference numbers denote like features. In the drawings.

DETAILED DESCRIPTION OF THE EMBODIMENTS

Embodiments of the inventive concept are described below with reference to accompanying drawings. These embodiments are provided as teaching examples and should not be interpreted to limit the scope of the inventive concept. For instance, certain embodiments include specific configurations of flash memory devices, but the inventive concept could also be embodied by other configurations. Moreover, certain aspects of the inventive concept may be embodied in nonvolatile memory devices other than flash memory devices, such as magnetoresistive random access memory (MRAM) or phase change random access memory (PRAM).

In certain embodiments, a flash memory device comprises memory blocks divided into a plurality of regions. Program and erase (program/erase) cycles of each divided region are stored and managed through a program/erase cycle table. Each of the divided regions may correspond, for instance, to one or more wordlines or one or more pages of data.

To distribute program/erase cycles among the different memory blocks and the different regions of the memory blocks, a controller determines which memory blocks have the fewest program/erase cycles based on the program/erase cycle table. The controller also determines which regions within those memory blocks have the minimum and maximum number of program/erase cycles. Then, based on the difference between the minimum and maximum number of program/erase cycles, the controller controls programming to be performed according to different rules.

For instance, if the difference between a maximum and minimum program/erase count value among the different regions of a memory block is lower than a predetermined reference value, the regions may be programmed in a certain order dictated by a first program rule. Otherwise, if the difference is greater than or equal to the predetermined reference value, the regions may be programmed in a different order dictated by a second program rule. By using these program rules, the program/erase cycles of memory blocks in the flash memory device may be evenly distributed throughout the regions of the flash memory, increasing the overall life span of the flash memory device.

Figure 1:
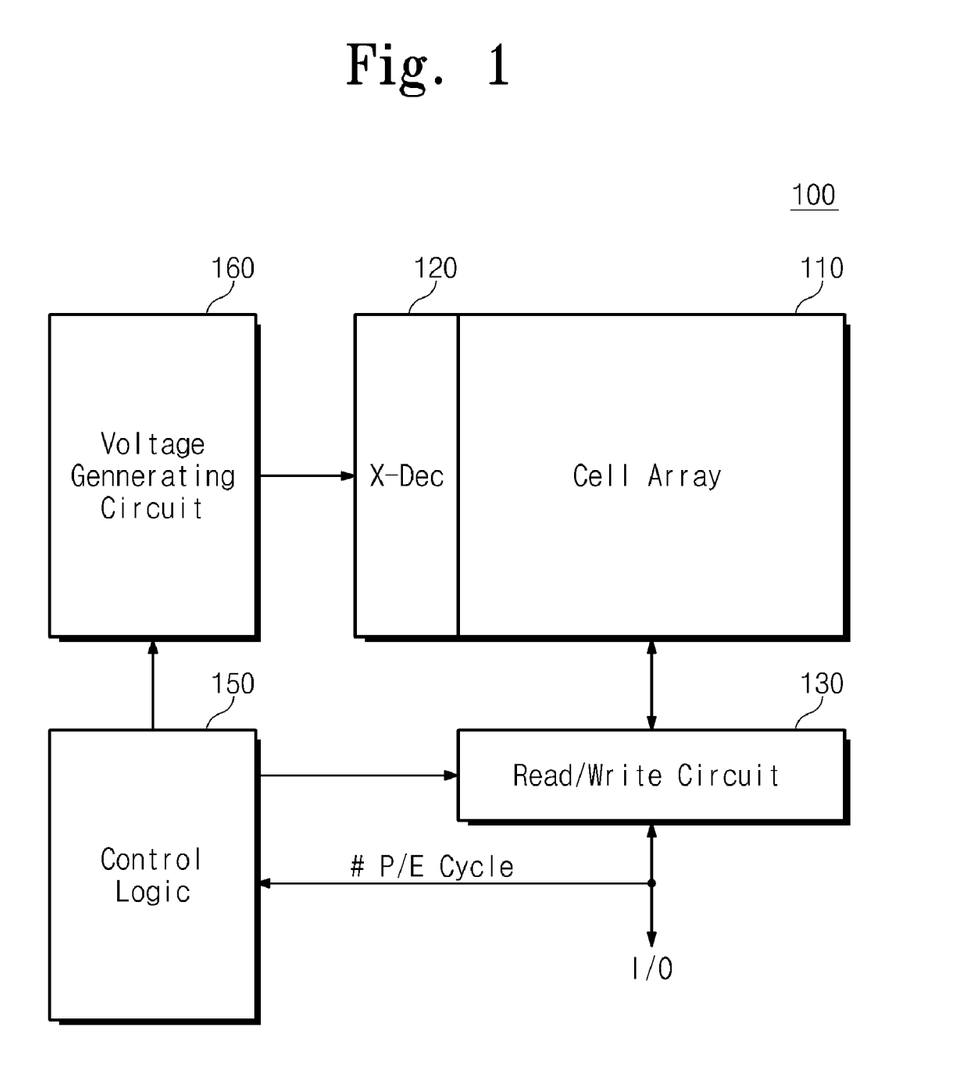
FIG. 1 is a diagram illustrating a flash memory device according to an embodiment of the inventive concept.

FIG. 1 is a diagram illustrating a flash memory device 100 according to an embodiment of the inventive concept.

Referring to FIG. 1, flash memory device 100 comprises a memory cell array 110, a decoding circuit 120 (labeled X-DEC in FIG. 1), a read/write circuit 130, a control logic component 150, and a voltage generating circuit 160.

Memory cell array 110 comprises memory cells arranged in a plurality of rows connected to corresponding wordlines and a plurality of columns corresponding to corresponding bitlines. Memory cell array 110 is divided into a main region and a spare region, where the main region stores general data, and the spare region stores additional information related to the general data, such as flag information, error correction code, device code, maker code, page information, and so on.

For explanation purposes, it will be assumed that memory cell array 110 is a NAND-type flash memory. In a NAND-type flash memory, program and read operations are executed in units of a page, and erase operations are executed in unit of a memory block, which comprises multiple pages. In memory cell array 110, information related to program and erase operations of each page is stored in the spare region. The main region and the spare region are not limited to specific configurations or organizational structure, but may be configured or organized in various forms in memory cell array 110. In addition, the number of bits stored in each memory cell of memory cell array 110 may vary. For instance, memory cell array 110 may comprise multi-level cells each storing two or more bits of data.

As will be described below with reference to FIGS. 2-13, memory blocks in memory cell array 110 are divided into a plurality of regions, where each region corresponds to one or more wordlines, or one or more pages of data. A program/erase cycle count "#P/E cycle" of each memory block and of each of the regions is stored and managed in a program/erase (P/E) cycle table 30 (see FIG. 5). The P/E cycle table is typically stored in the spare region of memory cell array 110 and be managed by control logic component 150 or an external control unit, such as a host.

Read/write circuit 130 is controlled by control logic component 150 and operates as a sense amplifier or a write driver to transfer data to and from memory cell array 110. During program operations, read/write circuit 130 operates as a write driver for driving the bitlines with voltages depending on data to be stored in memory cell array 110.

Read/write circuit 130 typically comprises a plurality of buffers (not illustrated) each corresponding to the columns or bitlines, or pairs of columns or bitlines. Read/write circuit 130 receives data to be programmed in memory cell array 110 from the buffers and drives the bitlines according to the received data. The data to be programmed by read/write circuit 130 may comprise both normal data provided from a user or host and program/erase cycle "#P/E cycle" data of memory blocks and corresponding divided regions.

During read operations, read/write circuit 130 operates as a sense amplifier for reading data from memory cell array 110. Read operations can be executed by read/write circuit 130 on both the main region and the spare region. In other words, read/write circuit 130 can read both normal data and additional information such as a program/erase cycle "#P/E cycle". Normal data read from read/write circuit 130 is typically output through the buffer to an external unit, such as a host, while program/erase cycle "#P/E cycle" data read from read/write circuit 130 is provided to control logic component 150.

Control logic component 150 determines a selected memory block to be programmed, and a program rule to be used on the memory block by analyzing the program/erase cycle "#P/E cycle" data provided from read/write circuit 130. For instance, controller 150 may determine the selected memory block as the memory block with the fewest number of erase cycles, or the lowest program/erase cycle count. Then, after controller 150 determines the selected memory block, controller 150 may determine a program rule to use for programming different regions of the selected memory block based on the difference between the minimum and maximum program/erase cycle (P/E cycle) count. For simplicity of explanation, the difference between the minimum and maximum P/E cycle count of the regions within a memory block will be denoted $\Delta P/E$.

Where the value of $\Delta P/E$ of the selected memory block exceeds a predetermined reference value, the regions of the selected memory block may be programmed according to a first program rule, such as a Min-Max rule. According to the Min-Max rule, memory cell regions are programmed in an order starting from a lowest region (e.g., region 1) and moving toward higher regions (e.g., region "m"). On the other hand, where the value of $\Delta P/E$ of the selected memory block is less than or equal to the predetermined reference value, the regions of the selected memory block may be programmed according to a second program rule, such as a Max-Min rule. According to the Max-Min rule, memory cell regions are programmed starting from a highest region (e.g., region "n") and moving toward lower regions (e.g., region "1"). As alternatives to the first and second program rules, it is also possible to used a third program rule, such as a modified Min-Max rule where the starting point is chosen other than the lowest region. It is also possible to use a fourth program rule, such as a random rule where regions are programmed randomly.

In the Min-Max and Max-Min rules, the lowest region may be a region of memory cells, such as a page, that are connected to a lowest set of wordlines, e.g., wordlines 1 and 2. Similarly, the highest region may be a region of memory cells, such as a page, that are connected to a highest set of wordlines, e.g., wordlines "m−1" and "m".

Control logic component 150 controls decoding circuit 120, voltage generating circuit 160, and read/write circuit 130 to perform read and program operations in accordance with a determined program rule. Voltage generating circuit 160 generates wordline voltages, such as a program voltage Vpgm, a read voltage Vread, a pass voltage Vpass, and supplies the wordline voltages to the wordlines. Voltage generating circuit 160 also generates voltages to be supplied to a bulk (e.g., a well region) of the memory cells. Voltage generating circuit 160 generates the voltages under the control of control logic component 150. Decoding circuit 120 selects one of the memory blocks (or sectors) of memory cell array 110 under the control of control logic component 150 and selects one of the wordlines of the selected memory block. Decoding circuit 120 supplies the wordline voltages generated by voltage generating circuit 160 to the selected wordline and non-selected wordlines under the control of control logic component 150.

Figure 2:
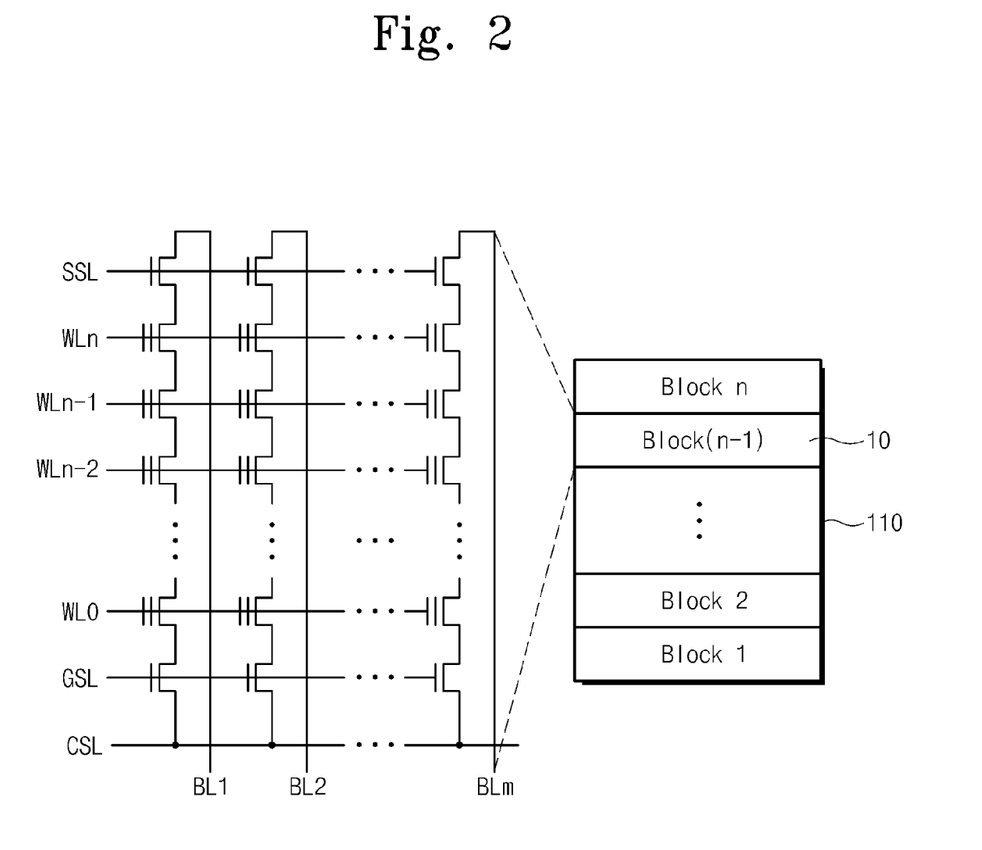
FIG. 2 is a diagram illustrating an embodiment of a memory cell array in FIG. 1.

FIG. 2 is a diagram illustrating an embodiment of memory cell array 110 of FIG. 1. Referring to FIG. 2, memory cell array 110 comprises a plurality of memory blocks "block 1, block 2, . . . , block n". In FIG. 2, reference numeral 10 indicates a configuration corresponding to a memory block "n−1". This configuration may also be used in other memory blocks of memory cell array 110.

In the NAND-type flash memory device, each of memory blocks 10 comprises a plurality of columns or strings (each referred to as a "NAND string") corresponding to bitlines BL1 through BLm. Each of the strings comprises a string selection transistor, a plurality of memory cells, and a ground selection transistor. In each of the strings, a drain of the string selection transistor is connected to a corresponding bitline, and a source of the ground selection transistor is connected to a common source line. The plurality of memory cells are connected to each other in series between a source of the string selection transistor and a drain of the ground selection transistor.

Control gates of memory cells arranged on the same row are connected in common with corresponding wordlines WL0 through WLn. The string selection transistor is controlled by a voltage applied through a string selection line SSL, and the ground selection transistor is controlled by the voltage applied through a ground selection line GSL. In addition, the memory cells are controlled by the voltage applied through the corresponding wordlines WL0 through WLn. Each of the memory cells connected to each of the wordlines WL0 through WLn stores data equivalent to one page or a number of pages. The configuration of the memory block illustrated in FIG. 2 can be applicable to both the main region and the spare region.

Figure 3:
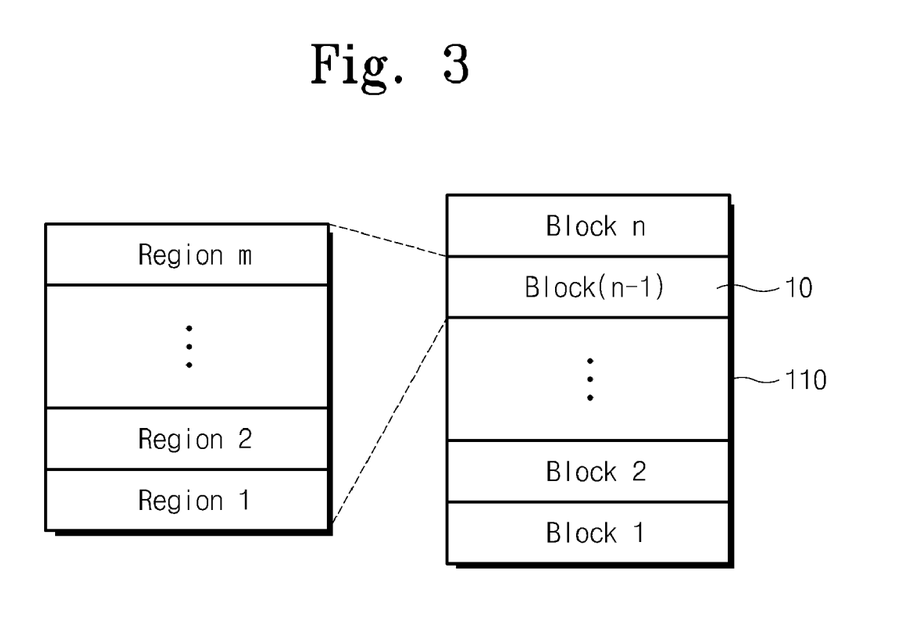
FIGS. 3 and 4 are diagrams illustrating examples of divided memory blocks of FIG. 2.
Figure 4:
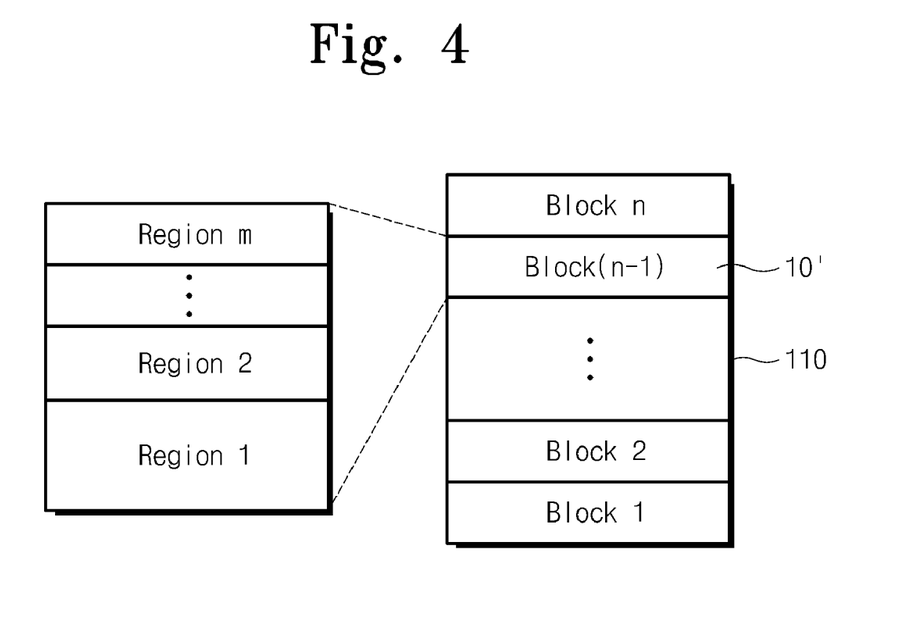

FIGS. 3 and 4 are diagrams illustrating examples of divided memory blocks in FIG. 2.

Referring to FIGS. 3 and 4, in flash memory device 100, each memory block 10 may be divided into a plurality of regions "region 1, region 2, ..., and region m". Each of these regions may correspond to one or more wordlines, or one or more pages. In the embodiment of FIG. 3, each of the regions in memory block 10 has the same size, and in FIG. 4, some of the regions in memory block 10' have different sizes. In other embodiments, the sizes and manner of dividing memory blocks can be varied.

Figure 5:
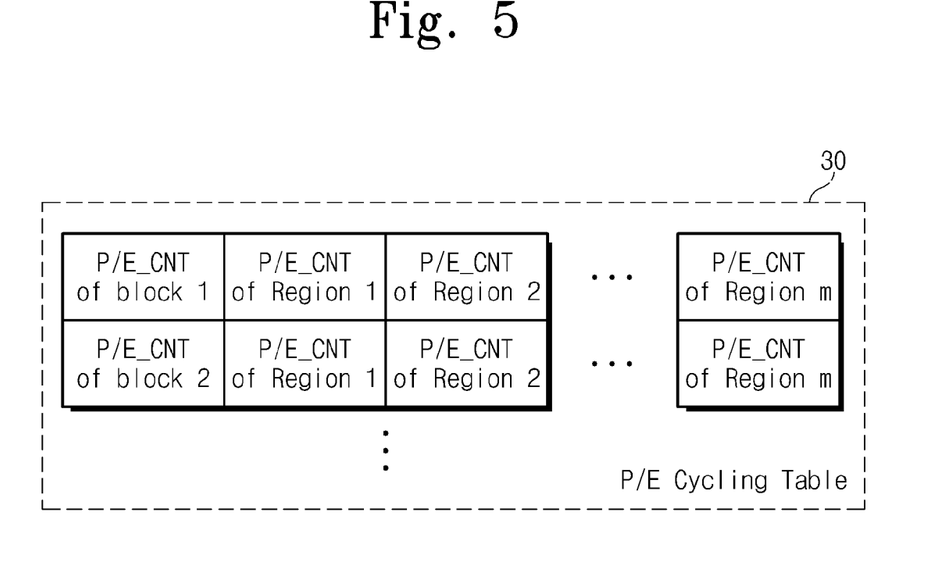
FIG. 5 is a diagram illustrating an example of an erase/program cycle table according to an embodiment of the inventive concept.

FIG. 5 is a diagram illustrating an example of a program/erase cycle table 30 according to an embodiment of the inventive concept.

Referring to FIG. 5, program/erase cycle table 30 stores program/erase count values "P/E_CNT" of blocks 1 through n. Further, program/erase cycle table 30 stores program/erase count values "P/E_CNT" of regions 1 through m for each of the memory blocks. The erase count value and the program count value of a region may be different because program and read operations are typically performed on a page by page basis while erasing is performed on an entire block. At the same time, however, different regions of a memory block typically have the same erase count value.

If a single program rule, such as the Min-Max rule, is used for all programming operations, the program/erase count values of some regions, such as the lower regions, may be greater than the program/erase count values of other regions, such as the upper regions. As a result, using only one program rule may lead some regions to wear out much sooner than other regions. But when a single region wears out, such as a page of memory cells connected to a single wordline, the entire memory block may be required to be disabled to prevent memory malfunctions.

To prevent these problems, memory blocks are divided into a plurality of regions as discussed above, and program/erase count values (especially, program count values of the regions) are managed through program/erase cycle table 30. Based on the program/erase count values, different program rules are used to determine an order of programming different regions of the selected memory block. Such rules may include, for instance, a Max-Min rule, a Min-Max rule, a modified Min-Max rule, or a random rule, as discussed above.

These rules tend to distribute program and erase cycles across different regions of a selected memory block to prevent some regions from wearing out more quickly than others. As a result, the life span of flash memory device 100 may be increased.

Figure 6:
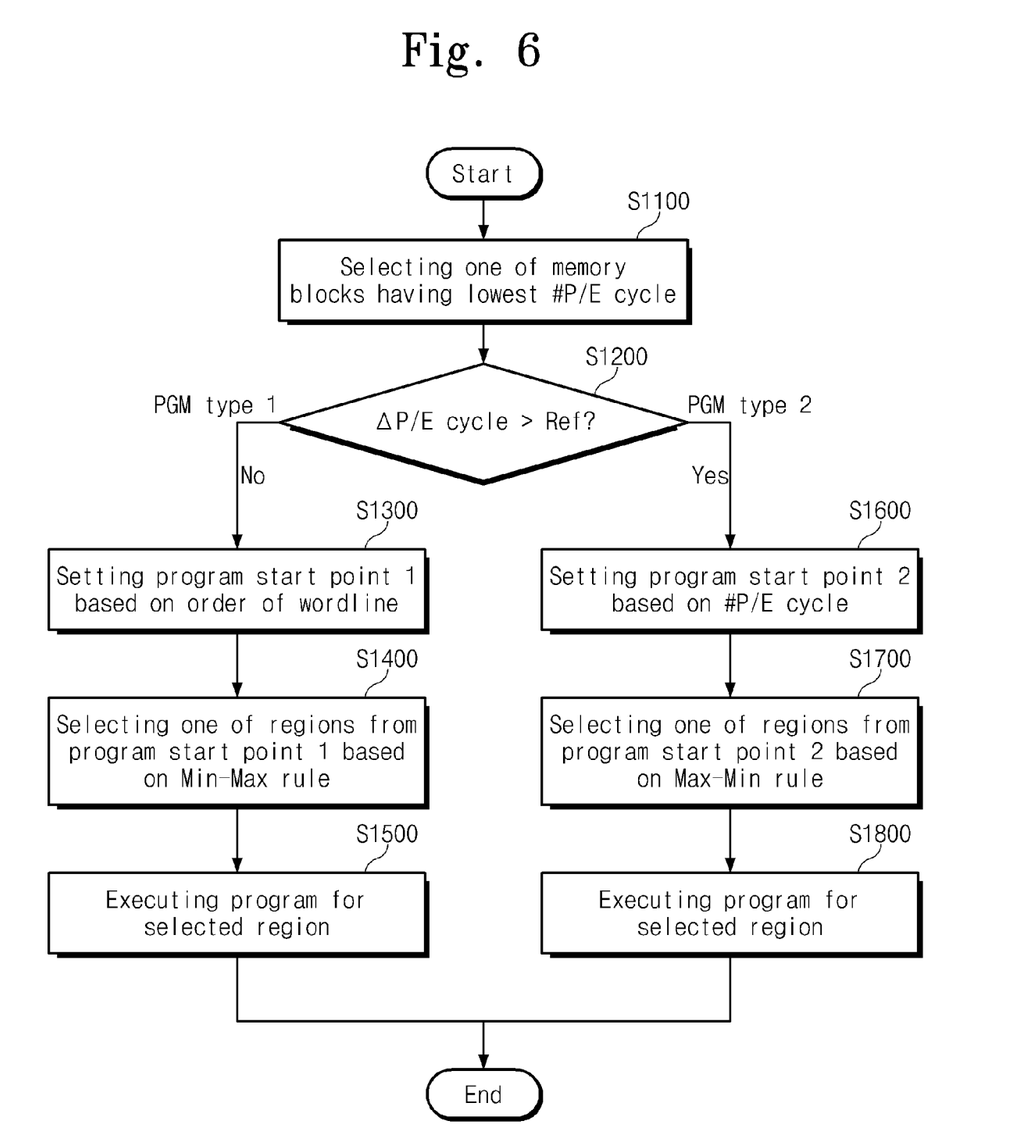
FIG. 6 is a flowchart illustrating a method of programming a flash memory device according to an embodiment of the inventive concept.
Figure 7:
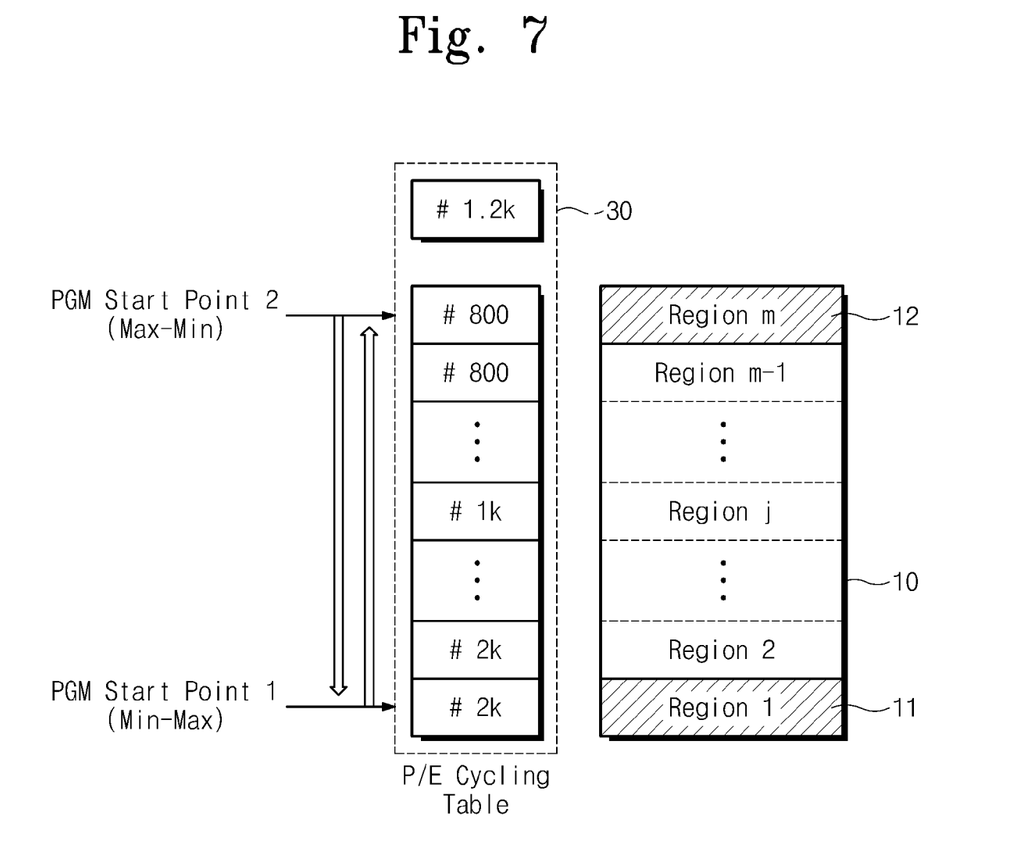
FIG. 7 is a diagram for explaining the method of FIG. 6.

FIG. 6 is a flowchart illustrating a method of programming a memory device according to an embodiment of the inventive concept, and FIG. 7 is a diagram for explaining the method of FIG. 6. In the description that follows, example method steps are denoted by parentheses (SXXX).

Referring to FIGS. 6 and 7, the method first selects a memory block having a lowest erase count value based on program/erase cycle table 30 (S1100). Thereafter, the method determines whether the difference ΔP/E between the maximum and minimum values of program/erase cycles "#P/E cycle" for regions 1 through m is higher than a predetermined reference value "Ref" (S1200). If the difference ΔP/E is higher than reference value "Ref" (S1200=Yes), a second type of program operation is performed using the second program rule (PGM type 2). Otherwise, if the difference ΔP/E is not higher than reference value "Ref" (S1200=No), a first program type of operation is performed using the first program rule (PGM type 1).

In the first type of program operation, a program start point 1 is set as a position to begin programming in memory block 10 (S1300). In this embodiment, as indicated by FIG. 7, program start point 1 is set as a lowermost region 11 of the selected memory block 10. Thereafter, regions to be programmed are selected based on program start point 1 (S1400). In particular, the regions are programmed in an order beginning at region 1, and moving toward higher numbered regions. In other words, once region 1 is programmed, a next programming operation programs region 2, and so on.

Once a region has been selected for programming, a program operation is performed on the selected region (S1500). To successively program different regions of selected memory block 10, steps S1400 and S1500 can be repeated based on received programming commands.

In the second type of program operation, a program start point 2 is set as a position in which the program first starts in the selected memory block 10 (S1600). In this embodiment, as illustrated by FIG. 7, the program start point 2 is set as an uppermost region 12 of selected memory block 10. Thereafter, regions to be programmed are sequentially selected from the program start point 2 (S1700). The selection process of step S1700 may be performed based on the Max-Min rule discussed above. In other words, regions may be selected for programming in an order from the highest numbered region to the lowest numbered region. After the region to be programmed is selected, a program is executed for the selected region (S1800). To successively program different regions of selected memory block 10, steps S1700 and S1800 can be repeated based on received programming commands.

The programming order of the first and second program rules is illustrative, and can be changed in different embodiments. For instance, the first program rule may be the Max-Min rule instead of the Min-Max rule, or similarly, the second program rule may be the Min-Max rule instead of the Max-Min rule.

Figure 8:
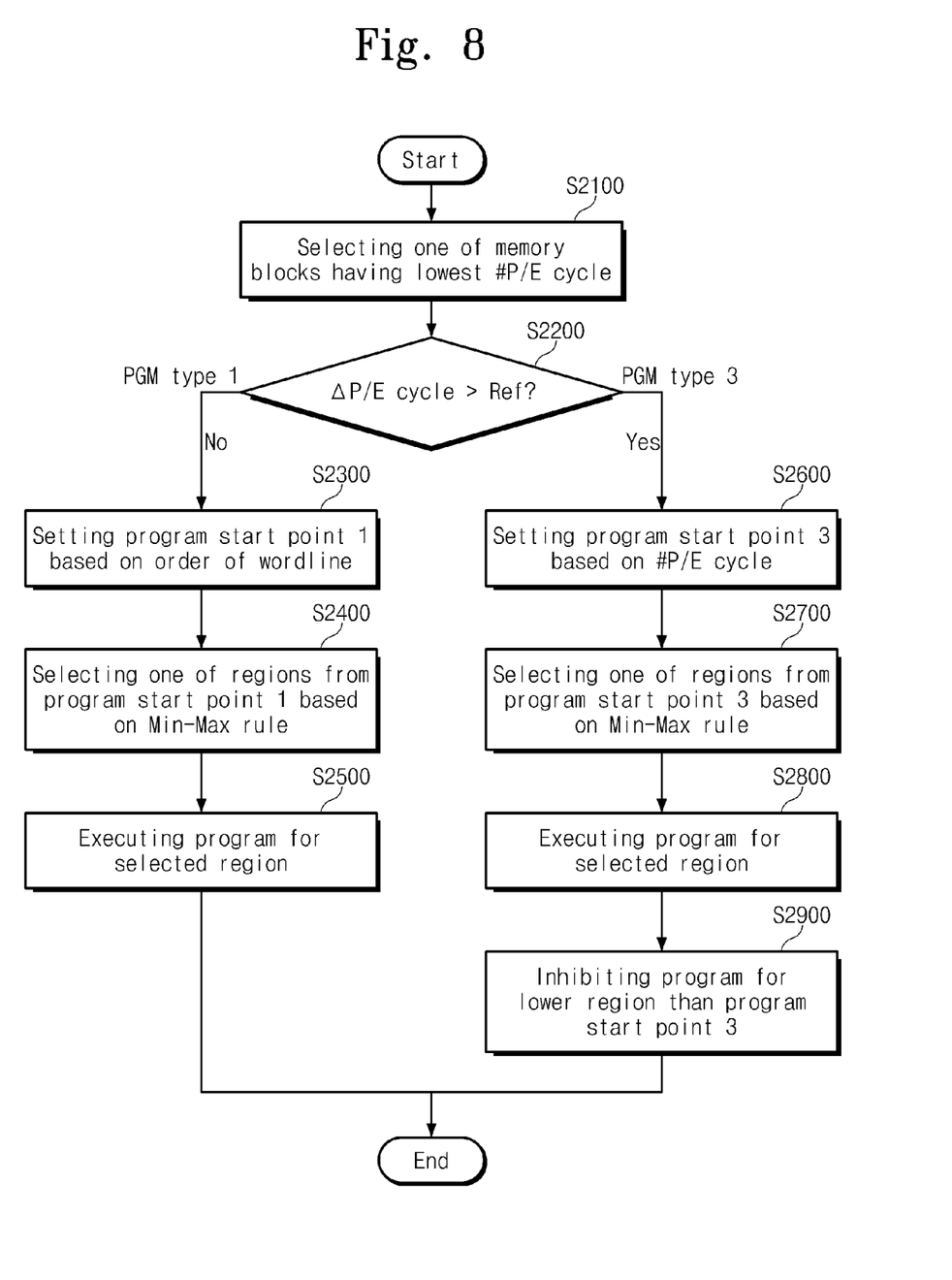
FIG. 8 is a flowchart illustrating a method of programming a flash memory device according to another embodiment of the inventive concept.
Figure 9:
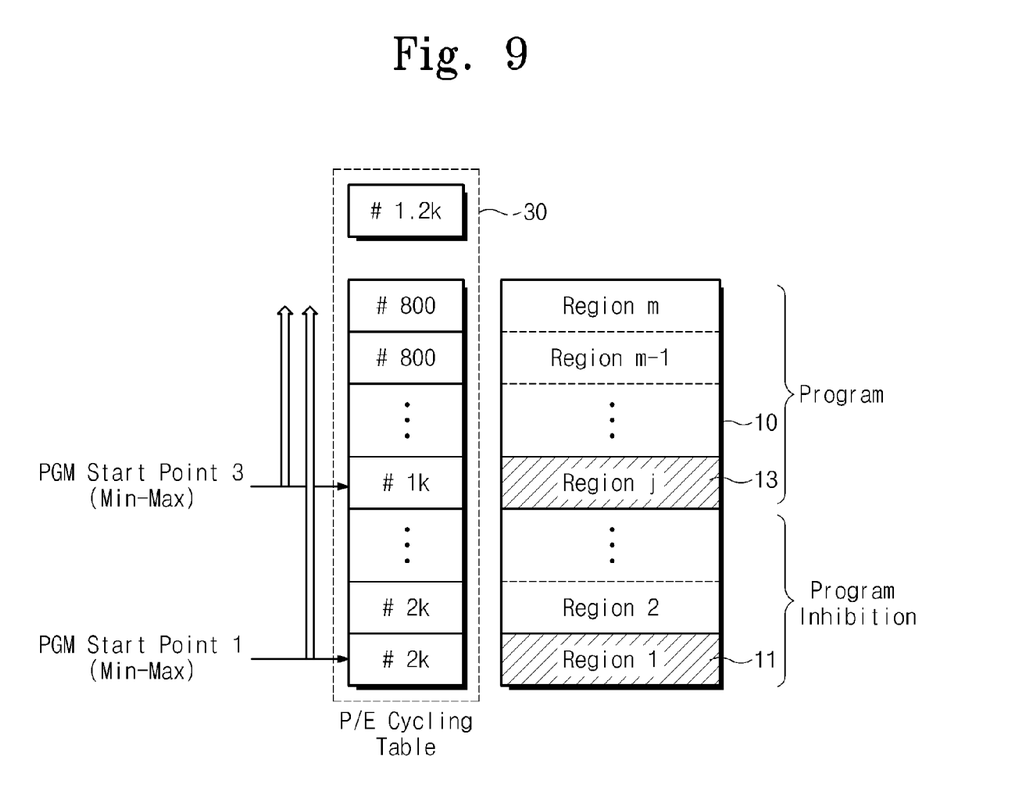
FIG. 9 is a diagram for explaining the method of FIG. 8.

FIG. 8 is a flowchart illustrating a program method according to another embodiment of the inventive concept, and FIG. 9 is a diagram for explaining the program method of FIG. 8.

Referring to FIGS. 8 and 9, the method first selects a memory block having a lowest erase count value based on program/erase cycle table 30 (S2100). Thereafter, the method determines whether the difference ΔP/E between the maximum and minimum values of program/erase cycles "#P/E cycle" for regions 1 through m is higher than a predetermined reference value "Ref" (S2200). If the difference ΔP/E is higher than reference value "Ref" (S2200=Yes), a third type of program operation is performed using the third program rule (PGM type 3). Otherwise, if the difference ΔP/E is not higher than reference value "Ref" (S2200=No), the first program type of operation is performed using the first program rule (PGM type 1).

In the first type of program operation, a program start point 1 is set as a position to begin programming in memory block 10 (S2300). In this embodiment, as indicated by FIG. 9, program start point 1 is set as the lowermost region 11 of the selected memory block 10. Thereafter, regions to be programmed are selected based on program start point 1 (S2400). In particular, the regions are programmed in an order beginning at region 1, and moving toward higher numbered regions. In other words, once region 1 is programmed, a next programming operation programs region 2, and so on.

Once a region has been selected for programming, a program operation is performed on the selected region (S2500).

To successively program different regions of selected memory block 10, steps S2400 and S2500 can be repeated based on received programming commands.

In the third type of program operation, a program start point 3 is set as a first region to program in selected memory block 10 (S2600). Program start point 3 may be chosen, for instance, as a region 13 having a value close to a predetermined program count value. This selection technique is an example, however, and program start point 3 may be set in various alternative ways. For instance, program start point 3 may alternatively be set as a region having a lowest program count value in selected memory block 10.

Subsequently, regions to be programmed are sequentially selected from the program start point 3 (S2700). In this embodiment, the selection process of step S2700 is performed based on the modified Min-Max rule. According to the modified Min-Max rule, each of the regions is sequentially selected from program start point 3 to the uppermost region of the selected memory block. After the region to be programmed is selected, a program is executed for the selected region (S2800). Additionally, as illustrated in FIG. 9, in the third type of program operation, programming is inhibited for regions below program start point 3 is (S2900). This inhibition may be achieved, for instance, by setting predetermined flag information. To successively execute program operations on selected memory block 10, steps S2700 to S2900 may repeated based on received commands.

The programming order of the first and third program rules is illustrative, and can be changed in different embodiments. For instance, the first program rule may be the Max-Min rule or a modified Min-Max rule instead of the Min-Max rule, or the third program rule may be the Min-Max rule, the Max-Min rule, or the modified Min-Max rule or modified Max-Min rule.

Figure 10:
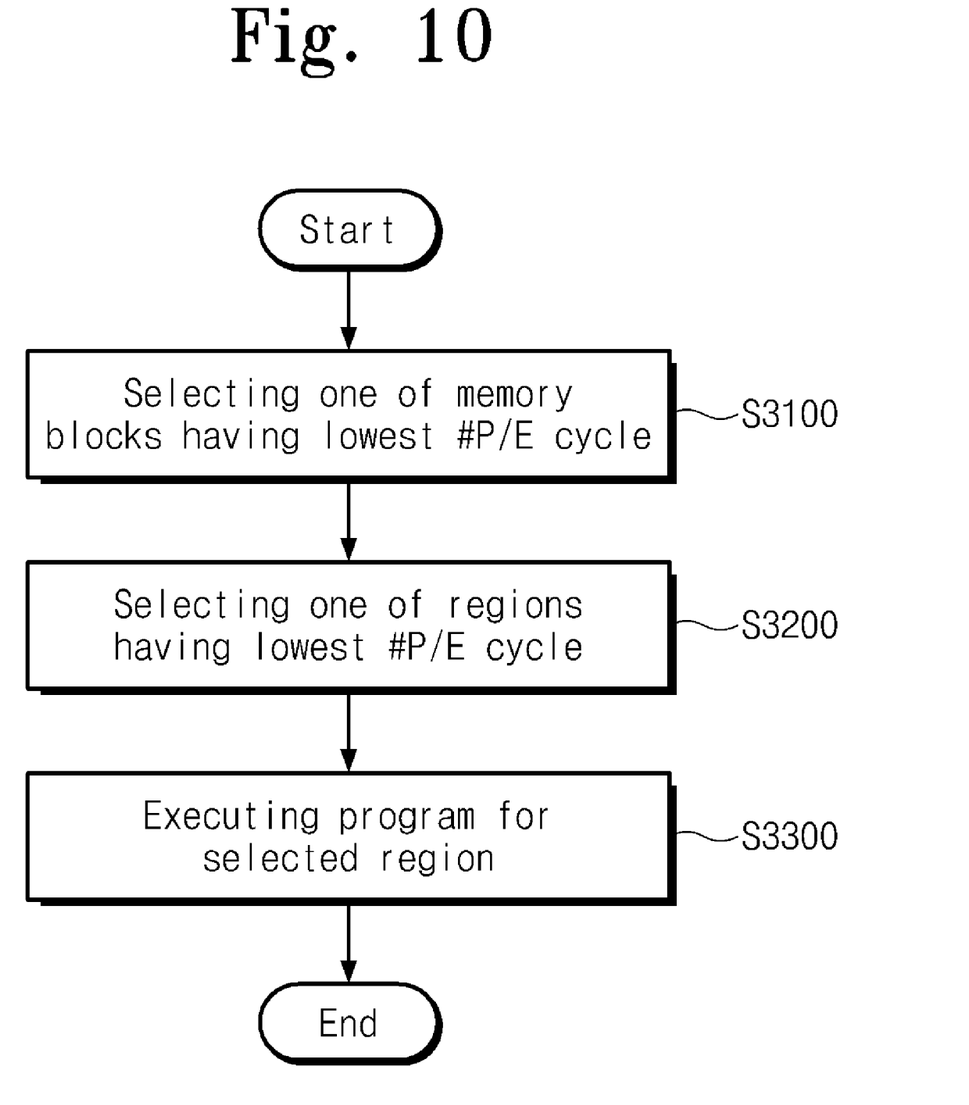
FIG. 10 is a flowchart illustrating a method of programming a flash memory device according to yet another embodiment of the inventive concept.
Figure 11:
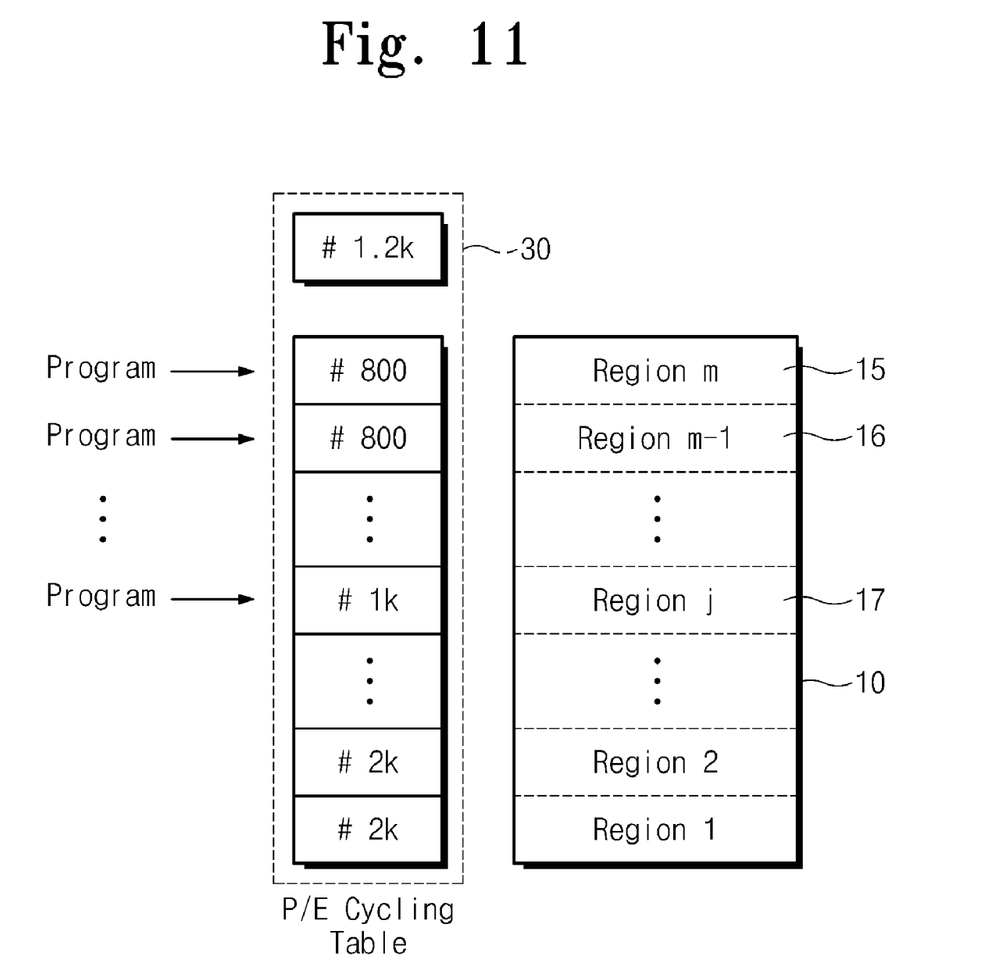
FIG. 11 is a diagram for explaining the method of FIG. 10.

FIG. 10 is a flowchart illustrating a method of programming a memory device according to another embodiment of the inventive concept, and FIG. 11 is a diagram for explaining the method of FIG. 10.

Referring to FIGS. 10 and 11, the program method first selects a memory block having the lowest program/erase count value P/E_CNT among memory blocks 1 through n (S3100). Thereafter, the method selects a region of the selected memory block having the lowest program/erase count (S3200). Next, the method executes a program operation on the selected region (S3300). To perform successive program operations on the selected memory block 10, steps S3200 and S3300 may repeatedly be executed based on received program commands.

As illustrated in FIG. 11, regions 15, 16, and 17 selected by the program method of FIG. 10 will not necessarily be selected in a sequence, but will be selected according to their respective program/erase count values. The method of FIG. 10 may also be executed when the difference ΔP/E of the selected memory block 10 is higher than the predetermined reference value "Ref". Where the difference ΔP/E of memory block 10 is lower than a predetermined reference value "Ref", the selected memory block 10 may be programmed using the first program rule illustrated in FIGS. 6 and 8.

In the above methods, a program rule can be selected based on the number of program/erase cycles performed on different regions of the selected memory block 10, and the selected program rule can be used to program the selected memory block 10. For instance, where the difference ΔP/E between the maximum and minimum number of program/erase cycles "#P/E cycle" in the regions of the selected memory block 10 is less than or equal to a predetermined reference value "Ref", selected memory block 10 may be programmed by a default program rule, such a first program rule, or Min-Max rule. Otherwise, if the difference ΔP/E is greater than a predetermined reference value "Ref", the selected memory block 10 may be programmed by applying a different program rule from the first program rule.

As indicated above, the applied program rules may comprise any one of a Max-Min rule, a modified Min-Max rule, and a random rule. By applying these different rules as discussed above, the program/erase operations of the flash memory cells can be more uniformly distributed across the flash memory cells, thus increasing the life span of flash memory device 100.

Figure 12:
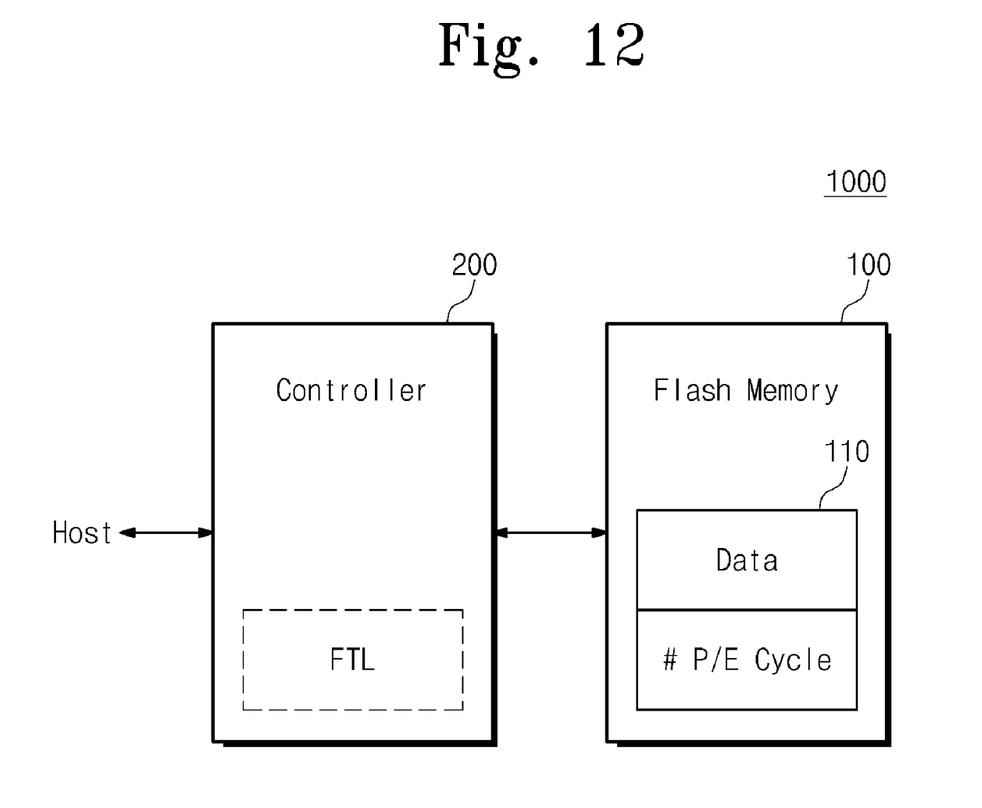
FIG. 12 is a diagram illustrating a memory system comprising the flash memory device of FIG. 1 according to an embodiment of the inventive concept.

FIG. 12 is a diagram of a memory system 1000 comprising the flash memory device of FIG. 1 according to an embodiment of the inventive concept.

Referring to FIG. 12, memory system 1000 comprises a flash memory device 100 and a controller 200. Flash memory device 100 is configured as illustrated in FIG. 1. Moreover, program operations of flash memory device 100 are performed as described above in relation to FIGS. 6 through 11. Therefore, additional descriptions of the operation of flash memory device 100 will be omitted to avoid redundancy.

In the embodiment of FIG. 12, flash memory device 100 stores normal data (labeled "Data") and additional information (labeled "#P/E cycle") regarding the number of program and erase operations performed on memory blocks and regions within memory cell array 110 of flash memory device 100. In some embodiments, the additional information of FIG. 12 is stored and managed in the form of a table such as that illustrated in FIG. 5. Additionally, such information can be stored, for instance, in a hidden region of memory cell array 110. The additionally information can also be transferred to a controller 200 outside flash memory device 100. This transfer can be made, for instance, upon initializing memory system 1000 on startup. Controller 200 can be used control flash memory device 100 and implement the methods of FIGS. 6 through 11.

Flash memory devices are generally unable to directly over-write stored data. Instead, flash memories such as flash memory device 100, must first erase stored data before storing new data in its place. This is referred to as an "erase-before-write" operation. In flash memory device 100, the unit of written data, such as a page, is less than that of erased data, which is typically an entire block. The requirement to erase before writing makes it difficult to use flash memory as a main memory because it slows performance. It also may interfere with direct utilization of hard-disk file system where the flash memory is used as an auxiliary storage device. Accordingly, as a control program, a flash translation layer (FTL) is provided in controller 200 to conceal erase operations of the flash memory. The FTL is typically provided in controller 200 in the form of firmware.

The FTL performs address mapping for logic addresses generated by the file system to physical addresses of flash memory device 100, during the program operation of flash memory device 100. To achieve a rapid address mapping, the FTL uses an address mapping table. Generally, the address mapping table may be constituted by a static random access memory (SRAM). Due to an address mapping function of the FTL, a host can identify the flash memory device as a hard disk drive (or SRAM) and can access the flash memory device in the same manner as the hard disk drive. In addition, the FTL may prevent stress to specific memory blocks of flash memory device 100 through a wear leveling operation. The stress applied to flash memory device 100 is associated with the life span of flash memory device 100.

As significant factors of stress, there are the number of erase operations and the number of program operations. The program/erase cycle "#P/E cycle" information stored in flash memory device 100 is provided to the controller outside of flash memory device 100 and may be used in address mapping operations and wear leveling operations. Controller 200 may directly store and manage program/erase cycle "#P/E cycle" information provided from flash memory device 100 as the address mapping table.

Flash memory system 1000 illustrated in FIG. 12 may constitute, for example, a memory card, a memory card system, and a solid state disk (SSD). Controller 200 may be constructed to communicate with an external device, such as a host, through any one of various protocols such as a universal serial bus (USB), multi media card (MMC), peripheral component interconnect-express (PCI-E), serial advanced technology attachment (SATA), parallel ATA (PATA), small computer system interface (SCSI), serial attached SCSI (SAS), enhanced small device interface (ESDI), and integrated drive electronics (IDE).

Flash memory devices according to selected embodiments can be used for data and/or code storage in a variety of portable electronic devices, such as cellular phones, a personal digital assistants (PDAs), digital cameras, portable game consoles, and MP3 players. The flash memory devices can also be used to store data and/or code in home applications such as high definition televisions (HDTVs), digital video disks (DVDs), routers, and global positioning systems (GPSs).

Figure 13:
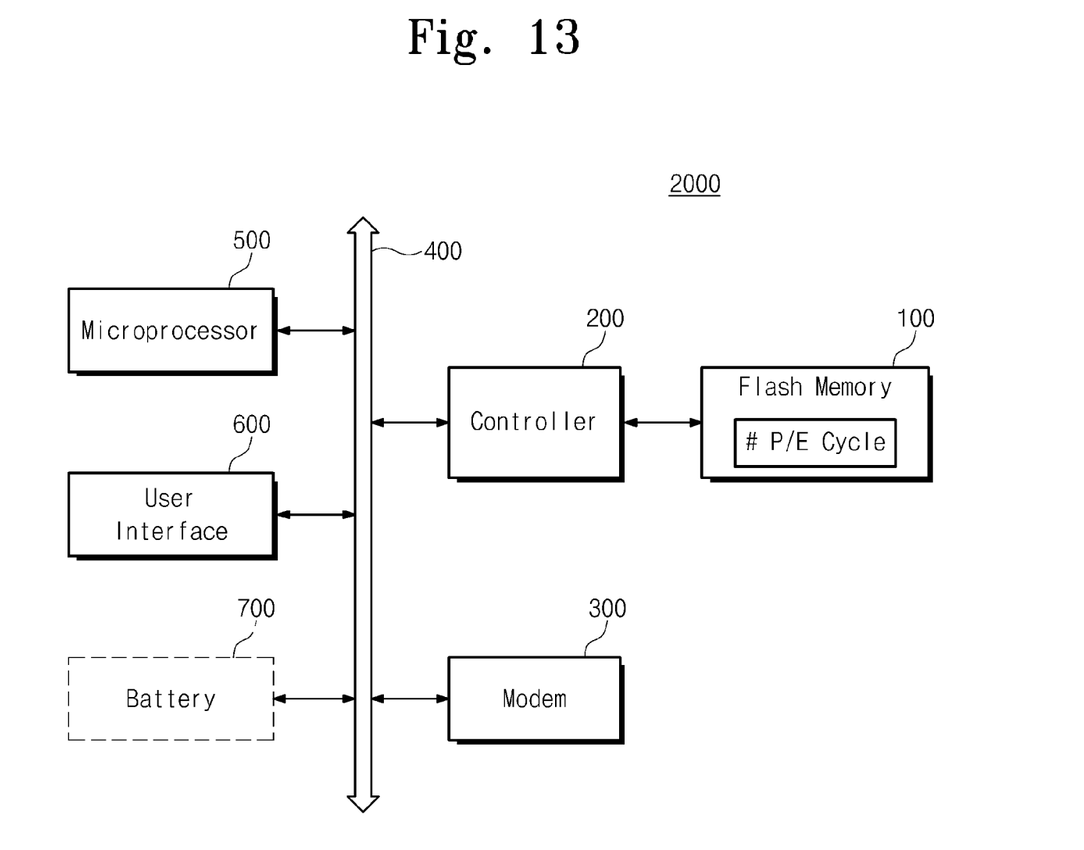
FIG. 13 is a diagram illustrating a computing system comprising the flash memory device of FIG. 1 according to an embodiment of the inventive concept.

FIG. 13 is a diagram illustrating a computing system 2000 comprising flash memory device 100 according to an embodiment of the inventive concept.

Referring to FIG. 13, computing system 2000 comprises flash memory device 100, controller 200, a modem 300 such as a baseband chipset, a microprocessor 500, and a user interface 500, all electrically connected to each other via a system bus 400. In the embodiment of FIG. 13, flash memory device 100 and controller 200 may function in the manner described above in relation to FIGS. 1 through 12. Accordingly, additional descriptions of these features will be omitted to avoid redundancy.

Where computing system 2000 is a mobile device, a battery 700 may be further provided to supply power to computing system 2000. Although not illustrated, computing system 2000 may further comprise an application chipset, a camera image processor (CIP), or a mobile DRAM. In some embodiments, controller 200 and flash memory device 100 may form, for example, a memory card and/or a memory card system and form an SSD.

The flash memory device and/or the controller according to selected embodiments of the inventive concept may be mounted in various types of packages. For example, the flash memory device and/or the controller may be mounted using a package configuration such as the following: package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

In the above embodiments of the inventive concept, the memory cells may be embodied using one of various cell structures having a charge storing layer. The cell structure having the charge storing layer may comprise, for example, a charge trap flash structure using a charge trapping layer, a stack flash structure having multi-stacked arrays, a flash structure not having source/drain, or pin-type flash structure.

In selected embodiments of the inventive concept, program/erase cycles of the memory blocks are evenly distributed throughout the overall regions of the nonvolatile memory to increase the lifetime of the nonvolatile memory device.

The foregoing is illustrative of certain embodiments of the inventive concept and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined by the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A nonvolatile memory device, comprising:
a memory cell array comprising a plurality of memory blocks each divided into a plurality of regions; and
a control logic component configured to select one of the memory blocks to be programmed based on a program or erase count of each of the respective memory blocks, and further configured to determine a program rule to be applied to the selected memory block based on program or erase counts of the respective regions of the selected memory block.

2. The nonvolatile memory device of claim 1, wherein the control logic component programs the selected memory block using a first program rule if a difference between a maximum program or erase count and a minimum program or erase count of the respective regions of the selected memory block is less than a predetermined reference value, and otherwise, the control logic component programs the selected memory block using a second program rule; and
wherein the first program rule requires the regions of the selected memory block to be programmed in a first direction and the second program rule requires the regions of the selected memory block to be programmed in a second direction opposite the first direction.

3. The nonvolatile memory device of claim 2, wherein the first program rule causes the regions of the selected memory block to be programmed in an order beginning at a first lowermost region and progressing toward a second higher numbered region.

4. The nonvolatile memory device of claim 1, wherein the control logic component programs the selected memory block using a first program rule if the difference between a maximum program or erase count and a minimum program or erase count of the respective regions of the selected memory block is less than a predetermined reference value, and otherwise, the control logic component programs the selected memory block using a second program rule; and
wherein the first program rule requires the regions of the selected memory block to be programmed in a first direction starting with a first region and the second program rule requires the regions of the selected memory block to be programmed in the first direction starting with a second region different from the first region.

5. The nonvolatile memory device of claim 4, wherein the first region is a lowermost region of the memory block and the second region is a higher numbered region of the memory block.

6. The nonvolatile memory device of claim 5, wherein the second region is a region that has a program or erase count close to a predetermined reference number stored in the control logic component.

7. The nonvolatile memory device of claim 4, wherein the second program rule requires the control logic component to inhibit programming of regions between the first region and the second region.

8. The nonvolatile memory device of claim 1, wherein the control logic component selects a memory block having a low program or erase count among the plurality of memory blocks and programs the selected memory block using a rule that requires the regions of the selected memory block to be programmed in an order beginning with a region having a lowest program or erase count.

9. The nonvolatile memory device of claim 1, wherein the control logic component stores a table comprising program or erase counts for the plurality of memory blocks and program or erase counts for the respective regions of the plurality of memory blocks.

10. The nonvolatile memory device of claim 1, wherein the memory cell array is a NAND flash memory cell array.

11. A method of programming a nonvolatile memory device, comprising:
    selecting a memory block having a low program or erase count from a plurality of memory blocks;
    selecting a program rule to be applied to the selected memory block based on information regarding program or erase counts of respective regions within the selected memory block; and
    programming one of the regions of the selected memory block using the selected program rule.

12. The method of claim 11, wherein selecting the program rule comprises:
    selecting a first rule as the program rule if a difference between a maximum program or erase count and a minimum program or erase count of the respective regions of the selected memory block is less than a predetermined reference value; and
    otherwise, selecting a second rule as the program rule;
    wherein the first rule requires the regions of the selected memory block to be programmed in a first direction and the second rule requires the regions of the selected memory block to be programmed in a second direction opposite the first direction.

13. The method of claim 11, wherein the selecting the program rules comprises:
    selecting a first rule as the program rule if a difference between a maximum program or erase count and a minimum program or erase count of the respective regions of the selected memory block is less than a predetermined reference value; and
    otherwise, selecting a second rule as the program rule;
    wherein the first rule requires the regions of the selected memory block to be programmed in a first direction starting with a first region and the second program rule requires the regions of the selected memory block to be programmed in the first direction starting with a second region different from the first region.

14. The method of claim 13, wherein the first region is a lowermost region of the memory block and the second region is a higher numbered region of the memory block.

15. The method of claim 14, wherein the second region is a region that has a program or erase count close to a predetermined reference number stored in the control logic component.

16. The method of claim 13, wherein the second rule requires the control logic component to inhibit programming of regions between the first region and the second region.

* * * * *